United States Patent [19]
Avery

[11] Patent Number: 5,274,262
[45] Date of Patent: Dec. 28, 1993

[54] SCR PROTECTION STRUCTURE AND CIRCUIT WITH REDUCED TRIGGER VOLTAGE

[75] Inventor: Leslie R. Avery, Flemington, N.J.

[73] Assignees: David Sarnoff Research Center, Inc., Princeton, N.J.; Sharp Corporation, Tenri, Japan

[21] Appl. No.: 803,880

[22] Filed: Dec. 9, 1991

Related U.S. Application Data

[63] Continuation-in-part of Ser. No. 700,314, May 9, 1991, Pat. No. 5,072,273, which is a continuation of Ser. No. 516,498, May 4, 1990, abandoned.

[30] Foreign Application Priority Data

May 17, 1989 [GB] United Kingdom ............... 8911360

[51] Int. Cl.[5] ........................................... H01L 29/72
[52] U.S. Cl. ..................... 257/362; 257/363; 257/577; 257/587
[58] Field of Search ............... 257/109, 146, 154, 162, 257/273-275, 566, 577, 587; 361/91

[56] References Cited

U.S. PATENT DOCUMENTS

| | | | |
|---|---|---|---|
| 4,064,525 | 12/1977 | Kano et al. | 357/13 |
| 4,100,561 | 7/1978 | Ollendorf | 357/86 |
| 4,167,018 | 9/1979 | Ohba et al. | 357/86 |
| 4,176,372 | 11/1979 | Matsushita et al. | 357/86 |
| 4,213,140 | 7/1980 | Okabe et al. | 357/86 |
| 4,224,634 | 9/1980 | Svedberg | 357/38 |
| 4,321,524 | 3/1982 | Petrovic | 323/229 |
| 4,327,368 | 4/1982 | Uchida | 357/42 |
| 4,400,711 | 8/1983 | Avery | 357/43 |
| 4,484,244 | 11/1984 | Avery | 361/56 |
| 4,513,309 | 4/1985 | Cricchi | 357/42 |
| 4,567,500 | 1/1986 | Avery | 357/38 |
| 4,595,941 | 6/1986 | Avery | 357/43 |
| 4,622,573 | 11/1986 | Bakeman, Jr. et al. | 357/42 |
| 4,631,561 | 12/1986 | Foroni et al. | 357/13 |
| 4,631,567 | 12/1986 | Kokado et al. | 357/38 |
| 4,633,283 | 12/1986 | Avery | 357/23.13 |
| 4,672,584 | 6/1987 | Tsuji et al. | 365/226 |
| 4,683,488 | 7/1987 | Lee | 357/42 |
| 4,760,433 | 7/1988 | Young | 357/23.13 |
| 4,797,724 | 1/1989 | Boler et al. | 357/42 |
| 4,876,584 | 10/1989 | Taylor | 357/23.13 |
| 4,939,616 | 7/1990 | Rountree | 257/173 |

OTHER PUBLICATIONS

D. C. Goldthorp et al., "An Integrated Circuit Composite PNPN Diode", International Electron Devices Meeting, Washington, D.C., Dec. 3-5, 1979, (IEEE) Technical Digest, pp. 180-183.

*Primary Examiner*—J. Carroll
*Attorney, Agent, or Firm*—William J. Burke

[57] ABSTRACT

A low breakdown voltage device for protecting an integrated circuit from transient energy is disclosed. This device provides an SCR having a reduced "snapback" trigger voltage compatible with submicron integrated circuit fabrication processes. A low breakdown voltage SCR protection circuit is also disclosed.

19 Claims, 3 Drawing Sheets

SCR PROTECTION STRUCTURE AND CIRCUIT WITH REDUCED TRIGGER VOLTAGE

This application is a continuation-in-part of U.S. patent application Ser. No. 07/700314, filed May 9, 1991, U.S. Pat. No. 5,072,273, which is a continuation of U.S. patent application Ser. No. 07/516498, filed May 4, 1990, now abandoned.

FIELD OF THE INVENTION

The field of the present invention relates generally to protection devices for integrated circuits, and more particularly to low trigger voltage protection devices.

BACKGROUND OF THE INVENTION

Many attempts have been made in the prior art to protect semiconductor devices, including bipolar transistors, field effect devices, and integrated circuits against damage due to voltage and current transients. Such protection devices have commonly taken the form of diode or transistor circuits that have been incorporated on the integrated circuit chip for internal transient protection. The design engineer is nevertheless faced with the problem of having to use valuable chip space for forming protection devices. Particularly on devices containing a large number of pins, it has been found that the protection devices occupy a significant amount of space and, therefore, the chip can become undesirably large.

Protection circuits advantageously utilizing silicon controlled rectifier (SCR) arrangements are known, for example, from Avery, U.S. Pat. No. 4,484,561; Kokado et al., U.S. Pat. No. 4,631,657; and Avery, U.S. Pat. No. 4,633,283; and Avery U.S. patent application Ser. No. 07/700,314.

In typical SCR arrangements utilized in the protection of integrated circuits, the trigger or firing voltage under quasistatic conditions is on the order of 25 volts to 40 volts. However, in practice, pulse conditions typically prevail and the actual trigger voltage is generally higher because of the time taken to establish the plasma. When such an SCR arrangement is utilized as part of an ESD protection circuit on a VLSI chip, for example, damage to other parts of the chip could occur before the "snap-back" SCR conduction regime has been established, i.e. before the SCR has achieved its "shorted" state. It is therefore desirable to achieve a lower trigger voltage for the SCR. In U.S. patent application Ser. No. 07/700314 Avery disclosed methods for reducing the trigger voltage of the SCR. As device geometries have shrunk to submicron dimensions the need for even lower trigger voltage protection devices which can be fabricated with a predictable trigger voltage to protect the thin gate oxide have become necessary.

SUMMARY OF THE INVENTION

In accordance with one embodiment of the invention, a protection device comprises a substrate of a first conductivity type, a first region of second conductivity type in the substrate, a second region of the second conductivity type in the first region, a third region of the first conductivity type in the first region and abutting the second region, a fourth region in the first region and extending beyond the boundary thereof into the substrate, a fifth region of the second conductivity type and spaced apart from said first region, and a sixth region of the first conductivity type and spaced apart from said first region, and a seventh region of opposite conductivity type to the fourth region and abutting the fourth region.

The invention is also an SCR protection circuit comprising first and second bipolar transistors, the emitter of the first bipolar transistor connected to a first terminal of the circuit and to the collector of the second bipolar transistor, the base of the first bipolar transistor connected to the collector of the second bipolar transistor, the collector of the first bipolar transistor connected to the base of the second bipolar transistor and to a second terminal, the emitter of the second bipolar transistor connected to the second terminal, and a means for reducing the trigger voltage of the SCR connected between the bases of the first bipolar transistor and the second bipolar transistor.

BRIEF DESCRIPTION OF THE DRAWING

In the Drawing like items are identified by the same reference numeral and.

DETAILED DESCRIPTION OF THE INVENTION

Figure 1:
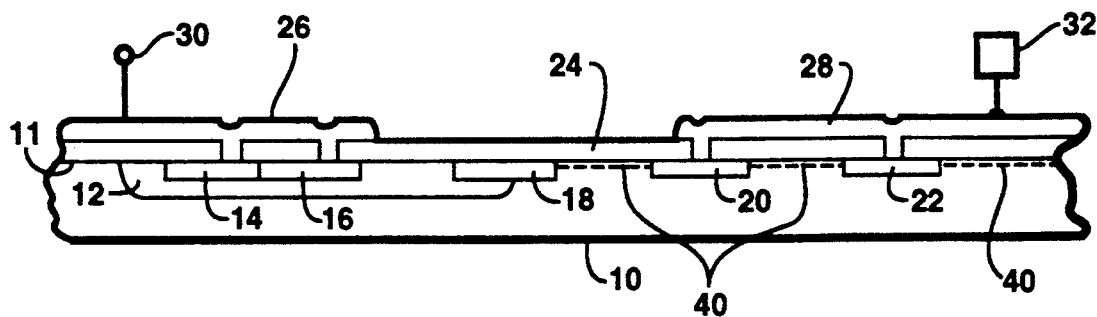
FIG. 1 shows a cross-section, not to scale, of an embodiment of the invention.

In FIG. 1, an embodiment of the present invention is shown which is compatible with typical integrated circuit processing techniques, and in particular with processes for integrated circuits having submicron dimensions. In FIG. 1, a substrate 10 is composed of a P− type conductivity semiconductor material such as silicon having a surface 11. It is typically relatively lightly doped, $10^{13}$/cc, and has a relatively low degree of conductivity. A region 12 of N− type conductivity, also relatively lightly doped and having relatively low conductivity is formed in substrate 10 at the surface 11. This region is usually referred to as a "well", in this case, an N− well.

N− well 12 has formed within it near the surface 11 a relatively heavily doped N+ type conductivity region 14, typically about $10^{18}$/cc, and a relatively heavily doped P+ type conductivity region 16, typically about $10^{18}$/cc, and both having relatively high conductivity. Regions 14 and 16 are formed entirely within the boundary of N− well 12 and preferably abut one another.

A further region 18, is formed in N⁻ well 12 in part, and in substrate 10 in part, thus extending through the boundary of N⁻ well 12 into substrate 10. The further region 18 may be either N+ LDD(N) or P+ conductivity type.

Figure 1A:
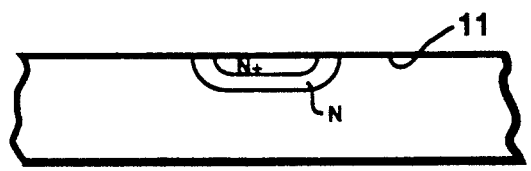
FIG. 1a shows a cross-section of an N+ LDD(N) region.

In submicron processes n type region 18 is preferably formed using a well known double implant process to form an N+ LDD(N) region at sites sensitive to breakdown. LDD stands for Lightly Doped Drain. The region is formed by an initial light implant of phosphorus, typically about $10^{15}$–$10^{16}$/cc, followed by a heavier implant of arsenic or phosphorus, typically about $10^{18}$/cc, at a later stage in the fabrication process. The result is a more graded junction having a higher breakdown voltage. The initial lighter implant is often called the LDD or lightly doped drain implant. The combination of these two dopings is what is meant by an N+ LDD(N) region. The N+ LDD(N) structure is illustrated in more detail in FIG. 1a. If the further region 18 is P+ conductivity type, it typically has a donor concentration of about $10^{18}$/cc.

Substrate 10 has also formed within it at the surface 11 a relatively heavily doped N+ type conductivity region 20, typically about $10^{18}$/cc, and a relatively heavily doped P+ type conductivity region 22, typically about $10^{18}$/cc. Region 22 preferably abuts region 20. Regions 20 and 22 have relatively high conductivity and are formed entirely outside the boundary of N⁻ well 12.

A P type surface control layer 40 extends along the surface 11 and a distance into the substrate 10 between the regions 18 and 20 and also between the regions 20 and 22 but preferably does not contact the N⁻ well 12 but may contact other N type regions. The control layer layer 40 is a well known part of standard semiconductor fabrication processes to increase the surface conductivity, raise the parasitic field inversion threshold and prevent the formation of parasitic MOS devices. The concentration of P type dopant in this region is typically between one and two orders of magnitude greater than the background dopant concentration, namely between about $10^{14}$/cc and $10^{15}$/cc. This dopant concentration is substantially less than the N dopant in the LDD region which is typically on several orders of magnitude greater and the N+ or P type dopant concentration in the regions 18, 18', 19 and 19' which are typically on the order of $10^{18}$/cc. Similar N type surface control layers are sometimes used in the N⁻ well region.

The surface 11 of substrate 10 and of the regions formed within it are covered by an insulating layer 24 which may be silicon dioxide, typically about 0.5 micrometers (μm) thick. Openings are provided through layer 24 for contacts. A first conductive layer 26, which may be aluminum, molybdenum, silicide or polysilicon, makes contact with each of regions 14 and 16. A second conductive layer 28 makes contact with each of regions 20 and 22. By way of example, conductive layer 26 is here connected to a terminal 30 and conductive layer 28 is connected to terminal 32.

In operation, the arrangement of FIG. 1 functions as a protective device with "SCR-type" behavior to provide protection when a certain trigger voltage is reached or exceeded. When this has occurred, a low resistance path is provided between terminals 30 and 32 for limiting any voltage excursion. It will be helpful to an understanding of the operation of the protective device of FIG. 1 to consider the equivalent circuit of FIG. 2. The explanation will be simplified by first describing the operation without the presence of region 18.

Figure 2:
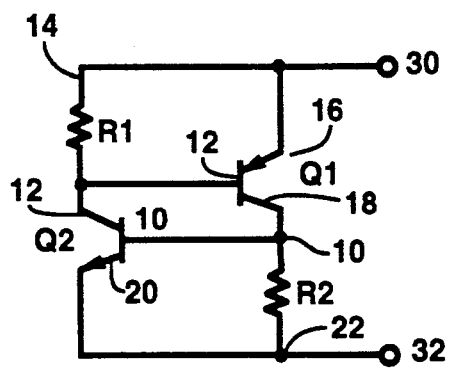
FIGS. 2 shows a schematic of an equivalent circuit corresponding to the embodiments of FIGS. 1 and 5 respectively.

Referring to FIGS. 1 and 2, N⁻ well 12 forms the base electrode of PNP transistor Q1 and P+ region 16 forms its emitter, connected to terminal 30. P⁻ substrate 10 forms the collector of transistor Q1. Resistor R1, connected between the emitter and base electrodes of transistor Q1, is formed substantially by the part of N⁻ well 12 between region 14 and the edge of N⁻ well 12 closest to N+ region 20.

The emitter of NPN transistor Q2 is formed by N+ region 20. Its base is formed by P⁻ substrate 10 and its collector is formed by N⁻ well 12. The emitter-base shunt resistor R2 is formed substantially by the region between the edge of N⁻ well 12 and P+ region 22. The arrangement of Q1 and Q2 forms an SCR having a threshold level above which it will be triggered into conduction, whereupon a "snap-back" voltage-current characteristic will be exhibited. The effective values of resistances R1 and R2 will primarily affect the value of the "holding current" below which the SCR will "unlatch" and substantially cease conduction.

The trigger voltage at which the conduction regime will be initiated is determined by breakdown voltages between component regions of the SCR. In the absence of region 18, triggering of the SCR will occur when the breakdown voltage between N⁻ well 12 and P⁻ substrate 10 is exceeded. In FIG. 2, this breakdown occurs across the junction between the base and collector electrodes of PNP transistor Q1 and of NPN transistor Q2. In a typical CMOS process the breakdown voltage will typically be between about 25 and 40 volts but the time taken to establish a plasma providing full conduction will result in higher effective "snap-back" trigger voltages for the short pulse durations encountered in typical electrostatic discharge transients.

In FIGS. 1 and 2, because of the higher doping level of region 18, the breakdown voltage between P+ region 18 and N⁻ well 12, typically between about 18 and 20 volts will be less than the breakdown voltage between P⁻ substrate 10 and N⁻ well 12. In effect, the P+ region 18 rather than substrate 10 forms the collector electrode of PNP transistor Q1. Accordingly, the lower breakdown voltage will control, and thus a lower "snap-back" trigger voltage for the SCR is achieved. The actual value of the trigger voltage can be controlled to a certain extent by selecting different spacings between P+ region 16 and P+ region 18 or adjusting the N well or N field doping levels. In a typical 0.8 μm process this breakdown voltage is between about 18 and 20 volts which is still to high to produce reliable protection for integrated circuits having submicron dimensions.

Figure 3:
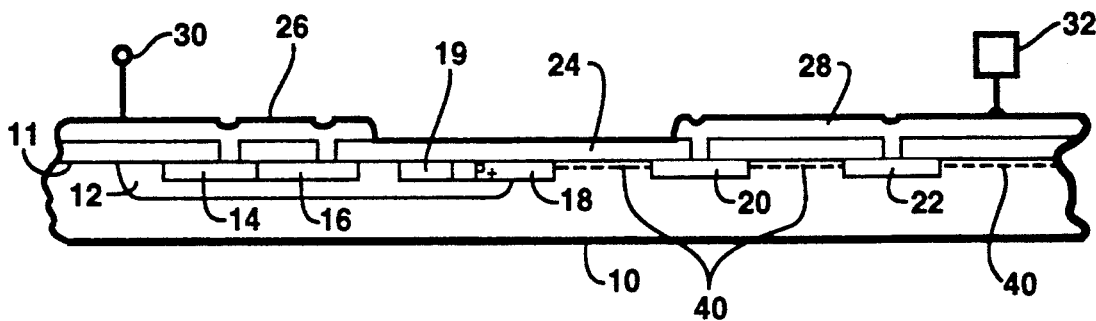
FIG. 3 shows a cross-section, not to scale, of an embodiment of the invention illustrating an improvement on the embodiment of FIG. 1.

In FIG. 3, an additional region 19 extends a distance into the N⁻ well 12 from the surface 11 and abuts the further region 18. The additional region 19 has N type conductivity and preferably has the N+ LDD(N) structure. The P type further region 18 and the N+ LDD(N) additional region 19 form a Zener diode. The breakdown voltage between the region 18 and the additional region 19 is between about 6 and 8 volts for a typical 0.8 μm process when the region 19 is formed using the N+ LDD(N) structure. In the formation of the Zener junction the P type region preferably only contacts the LDD portion of the N+ LDD(N) structure.

Figure 4:
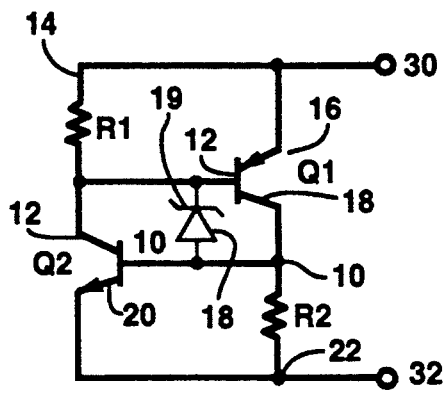
FIGS. 4 shows a schematic of an equivalent circuit corresponding to the embodiments of FIG. 3.

The Zener diode specifically formed in the structure illustrated in FIG. 3 is shown in the circuit illustrated in FIG. 4. The Zener diode has a breakdown voltage between about 6 and 8 volts. Consequently, the trigger voltage for the SCR is lower than the gate oxide breakdown voltage of MOS devices in the integrated circuit being protected which is typically between about 10 and 14 volts for a 0.8 μm process, thereby extending the utility of the SCR-type protection devices to this design rule range. Any P-N junction in a structure, including the back to back junctions forming the transistors Q1 and Q2 shown in FIG. 2, can undergo avalanche breakdown given the proper applied voltage. The invention lies in intentionally introducing Zener diodes at particular places in the structure to reliably produce very low breakdown voltages in a reliable way. These junctions incorporate doped regions having dopant concentrations substantially greater than the normal background levels.

Figure 5:
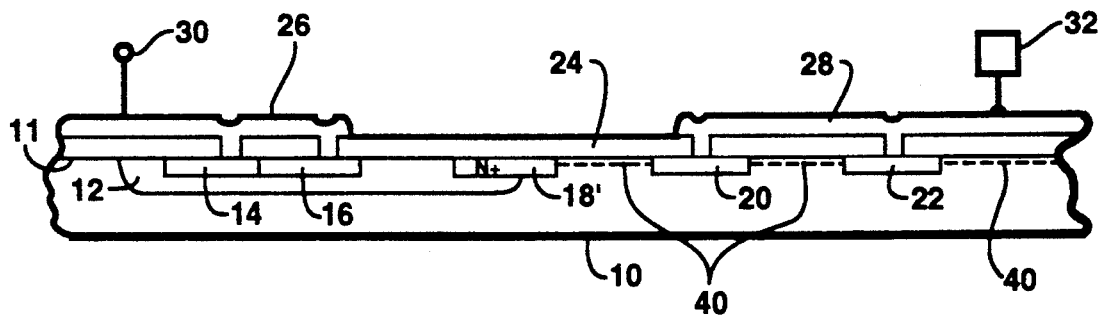
FIG. 5 shows a cross-section, not to scale, of an embodiment of the invention.

In FIG. 5, the further region 18' is of N type conductivity and is preferably an N+ LDD(N) type conductivity region when using submicron processes. The further region 18' and the control layer 40 form an junction extending between the bases of the transistors Q1 and Q2. The breakdown voltage between N+ region 18' and surface control layer 40 is between about 20 and 22 volts.

Figure 6:
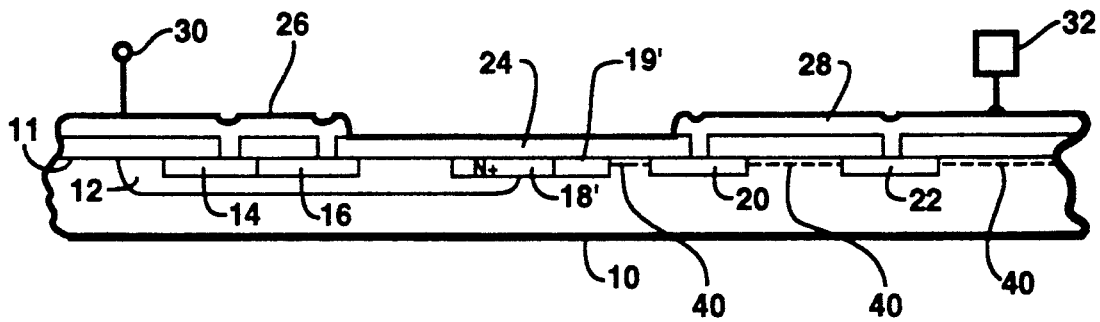
FIG. 6 shows a cross-section, not to scale, of an embodiment of the invention illustrating an improvement on the embodiment of FIG. 5.

In FIG. 6 the further region 18' is of N type conductivity and is preferably an N+ LDD(N) type conductivity region. A P+ type conductivity additional region 19' extends a distance into the substrate 10 from the surface 11 completely outside the N− well 12 and abuts further region 18'. The further region 18' and the P+ type conductivity additional region 19' form a Zener diode extending between the bases of the transistors Q1 and Q2 as shown in FIG. 6. The breakdown voltage between region 18 and P+ type conductivity additional region 19' is substantially less than the breakdown voltage between the N+ LDD(N) type region and the surface control layer 40 and is between about 6 and 8 volts for a typical 0.8 μm process. In the formation of the Zener junction the P type region preferably only contacts the LDD portion of the N+ LDD(N) type region.

Figure 7:
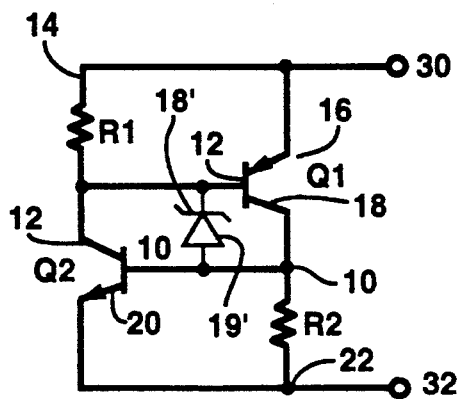
FIG. 7 shows a schematic of an equivalent circuit corresponding to the embodiments of FIG. 6 respectively.

The Zener diode specifically formed in the structure illustrated in FIG. 6 is shown in the circuit illustrated in FIG. 7. The Zener diode has a breakdown voltage between about 6 and 8 volts. The trigger voltage for the SCR is thus lower than the gate oxide breakdown voltage of MOS devices, thereby extending the utility of the SCR-type protection devices in this design rule range.

Figure 8:
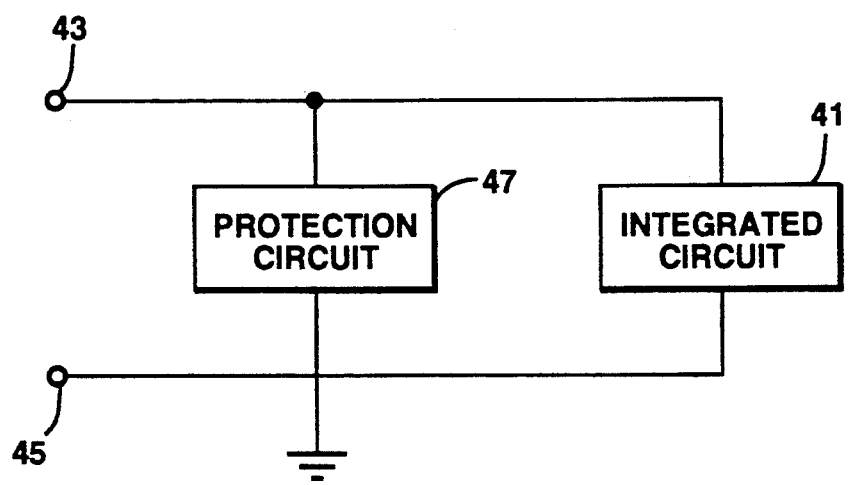
FIG. 8 is a schematic circuit diagram showing the protection circuit of the present invention with an integrated circuit being protected.

FIG. 8 shows one possible arrangement in which an integrated circuit 41, connected between a first terminal 43 and a second terminal 45, is protected by a protection circuit incorporating the invention. In the present example, terminal 43 is a terminal for a supply voltage, VDD, of first polarity and terminal 45 is shown as a supply terminal for a reference voltage VSS, typically ground potential. However, terminal 43 can be a signal terminal rather than a supply voltage terminal, and in fact can be connected to any terminal or lead which requires ESD protection. In FIG. 8, a protection circuit 47 is connected between terminals 43 and 45, that is, in parallel with integrated circuit 41. Protection circuit 47 thereby protects integrated circuit 41 by turning on in response to transient voltages to conduct transient energy to a source of reference potential, ground in this example, at a voltage less than the threshold voltage for damage to the integrated circuit. The protection circuit 47 is typically formed on the same semiconductor substrate as the integrated circuit 41.

Thus in one embodiment, the invention is a protection device comprising a substrate of a first conductivity type, a first region of second conductivity type in the substrate, a second region of the second conductivity type in the first region, a third region of the first conductivity type in the first region and abutting the second region, a fourth region in the first region and extending beyond the boundary thereof into the substrate, a fifth region of the second conductivity type and spaced apart from said first region, and a sixth region of the first conductivity type and spaced apart from said first region, and a seventh region of opposite conductivity type to the fourth region and abutting the fourth region. The seventh region is the additional region 19 or 19'.

From another viewpoint the invention is also an SCR protection circuit comprising first and second bipolar transistors, the emitter of the first bipolar transistor connected to a first terminal of the circuit and to the collector of the second bipolar transistor, the base of the first bipolar transistor connected to the collector of the second bipolar transistor, the collector of the first bipolar transistor connected to the base of the second bipolar transistor and to a second terminal, the emitter of the second bipolar transistor connected to the second terminal, and a means for reducing the trigger voltage of the SCR connected between the bases of the first bipolar transistor and the second bipolar transistor.

While the invention has been described in terms of a Zener diode connected between the bases of Q1 and Q2, it is clear that other semiconductor devices or structures connected between the bases of Q1 and Q2 which reduce the breakdown voltage can also be used in place of the Zener diode as a means for reducing the breakdown voltage of the SCR. Semiconductor devices or structures which have a breakdown voltage less than the collector-base breakdown voltage of the bipolar transistors are useful.

The devices of the invention can be fabricated utilizing standard photolithographic and etching steps for definition and ion implantation for forming the doped regions. Typically, a silicon substrate is used with, for example, boron as a P type dopant and phosphorus and/or arsenic as an N type dopant.

Modifications of the various embodiments of the invention may occur to one skilled in the art. For example, while the exemplary embodiment has been described in terms of particular conductivity types, converse conductivity types may be used so long as the relative conductivity types remain the same. Such and like modifications are intended to be within the spirit and scope of the invention, and the appended claims.

I claim:

1. A protection device comprising:
   a semiconductor substrate of a first conductivity type having a surface;
   a first region of second conductivity type in said substrate at said surface and having a boundary with said substrate;
   a second region of said second conductivity type within said first region and at said substrate surface;
   a third region of said first conductivity type within said first region at said substrate surface and adjacent said second region;
   a fourth region, which is of higher conductivity than the first region, in said first region at said substrate surface and extending across the boundary with the substrate into said substrate along said surface;
   a fifth region of said second conductivity type in said substrate at said surface and spaced apart from said first region;

a sixth region of said first conductivity type in said substrate at said surface and spaced apart from said first region;

a seventh region of opposite conductivity type to the fourth region and abutting the fourth region;

a first terminal in electrical contact with both said second and third regions; and a second terminal in electrical contact with both said fifth and sixth regions;

said substrate, first region and fifth region forming a first bipolar transistor of one conductivity type, and said substrate, first region and third region forming a second bipolar transistor of the opposite conductivity type which is connected to the first bipolar transistor.

2. The device of claim 1 wherein said seventh region extends a distance into said first region from said surface.

3. The device of claim 2 wherein said seventh region has the same conductivity type as said first region.

4. The device of claim 1 wherein said seventh region extends a distance into said substrate from said surface.

5. The device of claim 4 wherein said seventh region has the same conductivity type as said substrate.

6. The device of claim 1 wherein said fourth region is of said first conductivity type.

7. The device of claim 6 wherein said seventh region extends a distance into said first region from said surface.

8. The device of claim 1 wherein said fourth region is of said second conductivity type.

9. The device of claim 8 wherein said seventh region extends a distance into said substrate from said surface.

10. A structure comprising:

an integrated circuit having first and second terminals and a reference terminal;

a SCR protection device having first and second electrodes, each electrode being connected to one of said terminals;

wherein said protection device comprises:

a semiconductor substrate of a first conductivity type having a surface;

a first region of second conductivity type in said substrate at said surface and having a boundary with said substrate;

a second region of said second conductivity type within said first region at said substrate surface;

a third region, of said first conductivity type within said first region at said substrate surface and adjacent said second region;

a fourth region, which is of higher conductivity than said first region in said first region and extending across the boundary with the substrate into said substrate;

a fifth region of said second conductivity type in said substrate at said surface outside the boundary of said first region;

a sixth region of said first conductivity type in said substrate at said surface outside the boundary of said first region; and a seventh region of opposite conductivity type to the fourth region and abutting the fourth region;

wherein the first electrode is in electrical contact with the second and third regions and the second electrode is in electrical contact with the fifth and sixth regions;

the substrate, first region and fifth region forming a first bipolar transistor of one conductivity type, and the substrate, first region and third region forming a second bipolar transistor of the opposite conductivity type which is connected to the first bipolar transistor.

11. The device of claim 10 wherein said seventh region extends a distance into said first region from said surface.

12. The device of claim 11 wherein said seventh region has the same conductivity type as said first region.

13. The device of claim 10 wherein said seventh region extends a distance into said substrate from said surface.

14. The device of claim 13 wherein said seventh region has the same conductivity type as said substrate.

15. The structure of claim 10 wherein said fourth region is of said first conductivity type.

16. The structure of claim 10 wherein said fourth region is of said second conductivity type.

17. The structure of claim 10 wherein said second terminal is an input signal terminal of said integrated circuit.

18. The structure of claim 10 wherein said second terminal is an output signal terminal of said integrated circuit.

19. The structure of claim 10 wherein said second terminal is a voltage supply terminal of said integrated circuit.

* * * * *